(12) United States Patent
Edelstein et al.

(10) Patent No.: US 6,301,903 B1
(45) Date of Patent: Oct. 16, 2001

(54) APPARATUS FOR ACTIVATING FUSIBLE LINKS ON A CIRCUIT SUBSTRATE

(75) Inventors: Daniel Charles Edelstein, New Rochelle; Chandrasekhar Narayan, Hopewell Junction, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/495,896

(22) Filed: Feb. 2, 2000

Related U.S. Application Data

(62) Division of application No. 09/018,145, filed on Feb. 3, 1998, now Pat. No. 6,063,651.

(51) Int. Cl.⁷ ............................................. F25B 19/00
(52) U.S. Cl. .................................................... 62/51.1
(58) Field of Search ............................ 62/78, 264, 51.1

(56) References Cited

U.S. PATENT DOCUMENTS

| | | |
|---|---|---|
| 4,795,720 * | 1/1989 | Kawanabe et al. . |
| 5,089,443 | 2/1992 | Kerey et al. . |
| 5,374,590 | 12/1994 | Batdorf et al. . |
| 5,420,455 | 5/1995 | Gilmour et al. . |
| 5,523,253 | 6/1996 | Gilmour et al. . |
| 5,585,663 | 12/1996 | Bezama et al. . |
| 5,608,257 * | 3/1997 | Lee et al. . |
| 5,622,892 | 4/1997 | Bezama et al. . |
| 5,625,218 | 4/1997 | Yamadera et al. . |
| 5,838,361 * | 11/1998 | Corbett ............................ 347/262 |

* cited by examiner

Primary Examiner—William Doerrler
Assistant Examiner—Malik N. Drake
(74) Attorney, Agent, or Firm—Connolly Bove Lodge & Hutz

(57) ABSTRACT

A method and apparatus for activating fusible links on a circuit substrate. The circuit substrate is supported in a fixture which is cooled to a below ambient temperature. Cooling of the circuit substrate decreases the absorption of energy by the substrate, permitting a smaller spot size laser beam having a lower wavelength to be employed for interrupting the fusible links. The substrate is cooled by a refrigeration coil in heat transfer with the fixture holding the substrate. Moisture formation is avoided by placing the substrate and laser source in a controlled atmosphere.

8 Claims, 2 Drawing Sheets

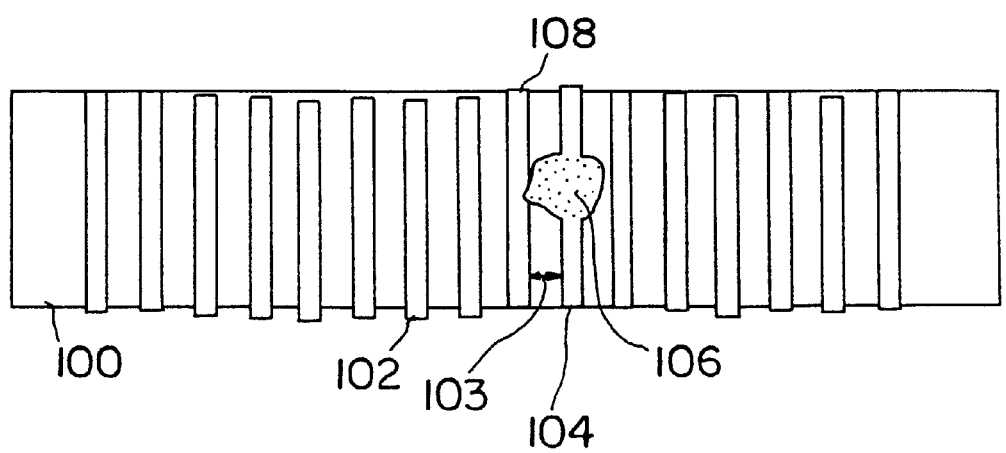
F I G. 1
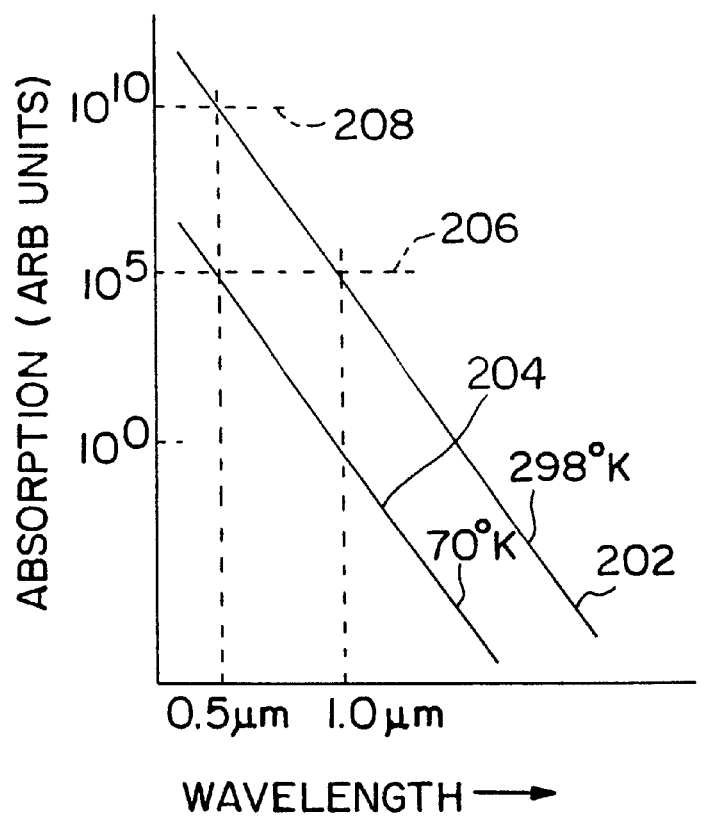
F I G. 2

APPARATUS FOR ACTIVATING FUSIBLE LINKS ON A CIRCUIT SUBSTRATE

RELATED APPLICATIONS

This application is a divisional application based on U.S. application Ser. No. 09/018,145, which was allowed Feb. 3, 1998, U.S. Pat. No. 6,063,651.

BACKGROUND OF THE INVENTION

The present invention relates to an apparatus and method for activating electrically programmable fusible links in VLSI circuits, specifically fusible links having a reduced interlink spacing, without damaging the underlying substrate.

High density dynamic random access memories (DRAMS) are designed with memory cell redundancy. The redundant memory cells avoid the loss of an entire memory in the event that a minor number of memory cells are not functioning. Activation of the redundant memory cells is accomplished by fusible links which are strategically placed throughout the memory. Activation of a fusible link results in the disabling of the defective memory cell, while enabling in its place a redundant memory cell.

The process of "blowing" fusible links is implemented by heating the fusible link which is to be blown. The heated fusible link melts or evaporates, creating an open circuit for replacing the defective memory cells with a functional cell.

The fusible links are made of aluminum, copper and other high conductive metal or metal alloys. The conductive fusible link generally has a central width portion which is smaller than the ends, to reduce the amount of energy necessary to melt the fusible link to create an open circuit condition.

The melting of fusible links may be accomplished using a laser beam having a controlled beam width. Additionally, the fusible links may be opened by applying a high current thereto, heating the fusible links as a result of power dissipation in the fusible link which is sufficient to melt the fusible links.

Utilizing the laser for blowing the fusible links requires that two conditions be observed to avoid damage to the circuit. The first is to have a beam width which is sufficiently narrow to blow only a single fusible link without inadvertently blowing an adjacent fusible link. The second condition which must be observed is avoiding damage to the underlying silicon substrate which supports the fuse elements.

These requirements are at odds with each other in that while it is desirable to decrease the distance between fusible links, i.e., pitch, there is a corresponding reduction in the laser beam width which produces a high energy beam which may damage the silicon substrate. In order to further increase the density of DRAMS, it is therefore desirable to reduce the pitch between fusible links, while at the same time being able to blow the fusible links without damaging the underlying silicon surface or adjacent fusible links.

SUMMARY OF THE INVENTION

It is an object of this invention to provide a method and apparatus for activating fusible links without damaging the underlying circuit substrate.

It is a further object of this invention to provide a method and apparatus for blowing fusible links having a reduced link pitch without damaging the underlying circuit substrate.

These and other objects of the invention are provided by a method and apparatus in accordance with the invention. A method is provided which will melt a fusible link having a reduced pitch without damaging the underlying silicon substrate. The process for blowing the fusible link reduces laser light absorption characteristics of the substrate. By reducing the absorption characteristics of the substrate, higher energy laser beams (with smaller wavelength) may be used, having a correspondingly smaller beam diameter for safely blowing fusible links on a tight pitch. The decreased beam width of the laser beam permits a decrease in the fusible link pitch and an increase in the laser beam energy density.

In accordance with a preferred embodiment, a substrate bearing the fusible links is supported in a chuck or fixture which is cooled to a temperature below ambient. As the cooling temperature decreases, the absorption characteristics of the substrate changes. As a result, it is possible to reduce the wavelength of the laser beam and corresponding beam width, i.e., spot size, to less than 1 $\mu$m. The substrate fixture may be cooled through a refrigeration unit having cooling coils in heat transfer contact with the fixture which in turn reduces the substrate temperature.

DESCRIPTION OF THE FIGURES

FIG. 1 illustrates a series of fusible links on a semiconductor substrate;

FIG. 2 illustrates the energy absorption curve for a silicon substrate as a function of incident radiation.

DESCRIPTION OF THE PREFERRED EMBODIMENT

Figure 3:
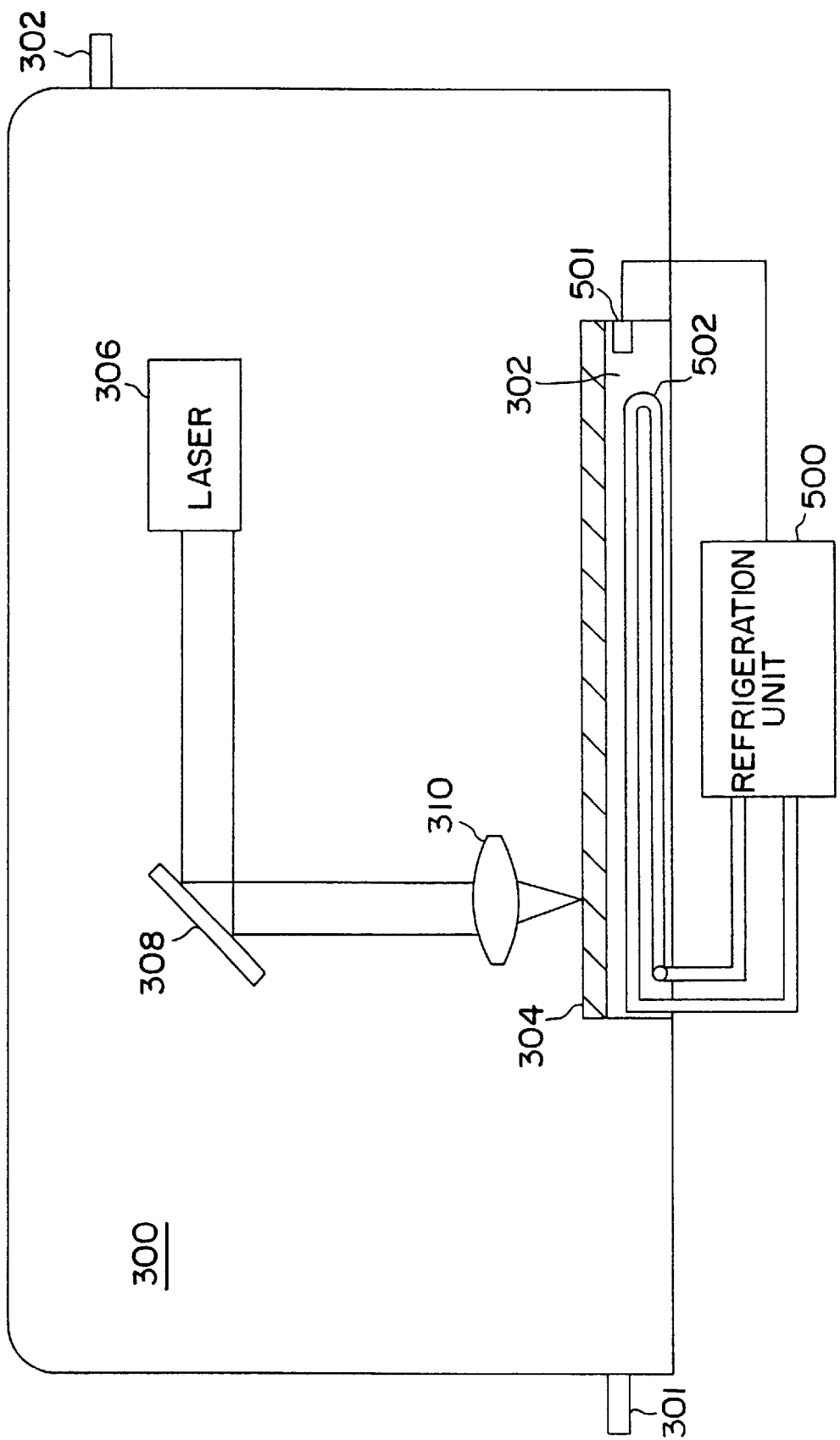
FIG. 3 illustrates the general configuration of an apparatus for blowing fusible links.

Referring now to FIG. 1, the general configuration of a plurality of fusible links on a VSLI silicon substrate 100 is shown. The fusible links have a width 104, and are separated from adjacent fusible link 108 by a spacing dimension 103. Each of the fusible links are connected to circuitry on the silicon substrate 100 for activating redundant memory cell elements or, in other applications, such as trimming the value of a component.

The blowing of a fusible link is typically accomplished with a laser beam having a wavelength of approximately 1.047 $\mu$m. The wavelength is chosen to avoid damaging the underlying substrate 100 due to energy absorption by the substrate. The laser of the aforementioned wavelength has a minimum diameter, or spot size which dictates the minimum fuse pitch 103. The minimum pitch size is necessary to avoid any inadvertent damage to an adjacent fusible link 108 from a base beam having a spot size which is large enough to overlap any neighboring fusible link. The damage zone 106 associated with the fusible link blowing process is directly related to beam size. Thus, the fusible link pitch must be limited by the spot size which is directly related to the wavelength of the incident laser radiation.

A reduction in the laser operating wavelength to 1 $\mu$m or less will provide for a spot size in the order of 1 $\mu$m, which permits fusible link pitches of that order. The absorption of radiation by the silicon substrate is strongly related to the wavelength, and increases exponentially as the wavelength decreases.

Referring now to FIG. 2, an energy absorption curve for a silicon substrate is shown as a function of incident radiation wavelength for two different temperatures. As is evident from FIG. 2, the energy absorption (shown in arbitrary units) on the y axis increases significantly as the wavelength decreases. However, the magnitude of energy absorption decreases significantly with temperature. Line 202 represents the absorption for a constant temperature 298° K, while line 204 demonstrates the absorption of the silicon substrate at a constant temperature of 70° K.

As the incident radiation wavelength decreases from 1 μm to 0.5 μm, the absorption increases correspondingly as shown by line 202 for the temperature of 298° K representing a room temperature condition.

It is evident from observing the absorption characteristics of silicon that a decrease in absorption of several orders of magnitude is possible by lowering the temperature of the substrate. Thus, where 0.5 μm radiation would have produced a value of absorption which would damage the silicon substrate, the same substrate at a lower temperature would not suffer damage from the same wavelength of radiation. As a preferred temperature, reducing the substrate temperature to 198° K will provide significant decreases in the energy absorption by the substrate. Using liquid nitrogen as a coolant for cooling the substrate permits temperatures as low as 77° K (the boiling point for liquid nitrogen) to be achieved which substantially eliminates any substrate damage.

In accordance with the invention, the lower temperature condition during blowing of fusible links enables use of radiation wavelengths below 1 μm, without suffering any substrate damage.

The consequences of lowering the temperature of the substrate provide for benefits even in the presence of higher wavelength lasers, such as those presently used having a wavelength of 1.047 μm or greater. Presently, this wavelength of radiation requires approximately 0.4 μj of energy within a 3.5 μm diameter spot size to blow an aluminum based fusible link. The same spot size can damage a silicon substrate if 0.65 μj of energy is applied to the substrate surface. Consequently, the laser beam must be operated such as to produce a high enough energy level, i.e., 0.4 μj to blow the fusible link, but maintain an energy level below 0.65 μj to avoid damage to the silicon substrate.

The present invention, by cooling the substrate, permits the damage threshold to be moved to 0.8 μj, thus avoiding the consequences of a narrow process window wherein energy levels produced by a laser must be tightly controlled.

Referring now to FIG. 3, an apparatus for blowing fusible links on a substrate 304 is illustrated. The enclosure 300 includes a substrate holder 302, such as a chuck or other fixture for holding the substrate 304 in place. A focusing lens 310 is shown in association with a mirror 308 directing the laser beam from laser 306 to a focused spot on a fusible link formed on the silicon substrate 304. Substrate 304 is cooled by a cooling coil 502 contained within the fixture 302 in heat transfer relationship with the substrate 304. The cooling coils are connected to a conventional refrigeration unit 500 which may utilize liquid nitrogen as a coolant, permitting coolant temperatures in the range of 77° K to be obtained. A temperature sensor 501 embedded in the fixture 302 is used to provide a temperature reading of the fixture and substrate to the refrigeration unit 500.

An inlet 301 and outlet 302 to the chamber 300 permits the insertion of a reactive gas such as chlorine into the chamber 300 providing a controlled atmosphere for the substrate. The reactive gas reacts with the fusible link metal to enhance the ability of the laser beam to blow the fusible link. In the event the fusible link contains a passivation layer, the gas may also interact with the passivation layer to enhance the laser beam's ability to react and melt the fusible link.

The refrigeration unit 500 may use as a refrigerant liquid nitrogen, which is circulated through the cooling coil 502 in the fixture 302. Temperature sensor 501 is attached to the fixture which provides for temperature sensing of the substrate. The thermostat on the refrigeration unit in combination with a signal from the temperature sensor 501 establishes a constant desirable temperature for the substrate.

The cooling of the substrate and supporting fixture may produce condensation of moisture during melting of the fusible links by the laser beam. A moisture free ambient atmosphere may be maintained by introducing dry air to the inlet 301 and expelling the air from the outlet 302.

Although the foregoing technique is most advantageous when fusible links are blown using a laser beam, the same benefits can be achieved for other techniques for blowing the fusible links, such as for instance providing a current through the fusible link which will heat and melt the link.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An apparatus for activating fusible links comprising:
a chamber for providing a controlled atmosphere;
a source of radiation for generating a laser beam having a spot size for melting a fusible link;
a substrate holder in said chamber for supporting a substrate having a plurality of fusible links; and
means for cooling said substrate for reducing the absorption of laser radiation by said substrate.

2. The apparatus for activating fusible links according to claim 1 wherein said means for cooling comprises a cooling coil connected to a source of refrigerant contacting said substrate holder.

3. The apparatus for activating fusible links according to claim 1 wherein said source of radiation comprises an ultraviolet laser having positioning means and a focusing lens for forming said spot of radiation onto a fusible link.

4. The apparatus according to claim 1 wherein said spot size is 1.3 or less microns in diameter.

5. The apparatus for activating fusible links according to claim 1 wherein said controlled atmosphere includes a rarified gas.

6. The apparatus for activating fusible links according to claim 1, wherein said laser beam wavelength is approximately 0.5 μm.

7. The apparatus for activating fusible links according to claim 1, wherein said substrate temperature is reduced to a temperature of substantially 198° K by said cooling means.

8. The apparatus for activating fusible links according to claim 1, wherein said laser beam wavelength is below 1 μm.

* * * * *